United States Patent
Park et al.

(10) Patent No.: US 7,560,960 B2
(45) Date of Patent: Jul. 14, 2009

(54) FREQUENCY SYNTHESIZER USING TWO PHASE LOCKED LOOPS

(75) Inventors: Joonbae Park, Seoul (KR); Kyeongho Lee, Seoul (KR); Yido Koo, Yungin-Si (KR); Jeong-Woo Lee, Seoul (KR)

(73) Assignee: GCT Semiconductor, Inc., San Jose, CA (US)

( * ) Notice: Subject to any disclaimer, the term of this patent is extended or adjusted under 35 U.S.C. 154(b) by 0 days.

(21) Appl. No.: 11/902,358

(22) Filed: Sep. 20, 2007

(65) Prior Publication Data

US 2008/0197891 A1    Aug. 21, 2008

(30) Foreign Application Priority Data

Sep. 21, 2006   (KR)   .................... 10-2006-0091730

(51) Int. Cl.
   *H03B 21/00*   (2006.01)
(52) U.S. Cl. .................... 327/105; 455/76; 708/271
(58) Field of Classification Search ................ 327/105; 455/76; 708/271
   See application file for complete search history.

(56) References Cited

U.S. PATENT DOCUMENTS

| | | | | |
|---|---|---|---|---|
| 4,626,787 A | * | 12/1986 | Mefford | 327/107 |
| 5,839,052 A | * | 11/1998 | Dean et al. | 725/106 |
| 6,959,175 B2 | * | 10/2005 | Ohtaki | 455/139 |
| 7,130,595 B1 | * | 10/2006 | Mohindra | 455/127.1 |
| 7,154,348 B2 | * | 12/2006 | Lee et al. | 331/34 |
| 7,324,789 B2 | * | 1/2008 | Jensen | 455/76 |
| 7,482,885 B2 | * | 1/2009 | Sridharan | 331/49 |
| 2001/0010713 A1 | * | 8/2001 | Yamamoto | 375/297 |
| 2002/0021762 A1 | * | 2/2002 | Takagi | 375/261 |
| 2002/0140512 A1 | * | 10/2002 | Stockton | 331/11 |
| 2003/0008630 A1 | * | 1/2003 | Ohtaki | 455/323 |
| 2004/0101080 A1 | * | 5/2004 | Lee | 375/375 |
| 2005/0218996 A1 | * | 10/2005 | Tamura | 331/1 A |
| 2006/0160492 A1 | * | 7/2006 | Jensen | 455/76 |
| 2006/0258311 A1 | * | 11/2006 | Pestryakov et al. | 455/165.1 |
| 2008/0063130 A1 | * | 3/2008 | Chen | 375/376 |
| 2008/0197891 A1 | * | 8/2008 | Park et al. | 327/105 |

* cited by examiner

*Primary Examiner*—Lincoln Donovan
*Assistant Examiner*—Adam D Houston

(57) ABSTRACT

The application discloses system and method embodiments related to a frequency synthesizer. Embodiments of a frequency synthesizer can have a low phase noise and a narrow channel spacing. Embodiments of a frequency synthesizer can use two phase locked loops. One embodiment of a frequency synthesizer can include a reference frequency oscillator for outputting a signal having a reference frequency, an integer-N phase locked loop to generate a first output frequency signal based on the reference frequency signal, a fractional-N phase locked loop to generate a second output frequency based on the reference frequency signal and a circuit to generate an output frequency signal by combining the first output frequency and the second output frequency.

19 Claims, 6 Drawing Sheets

FREQUENCY SYNTHESIZER USING TWO PHASE LOCKED LOOPS

FIELD OF THE INVENTION

The application relates to a frequency synthesizer.

BACKGROUND OF THE INVENTION

FIG. 1 is a diagram illustrating a prior art frequency synthesizer employing one phase locked loop. Referring to FIG. 1, the frequency synthesizer, i.e. a single phase locked loop has a reference frequency oscillator 11, a phase detector 12, a low pass filter 13, a voltage controlled oscillator 14 and a frequency divider 15.

A synthesized frequency Fout is N times the reference frequency Fref being outputted from the reference frequency oscillator 11. Accordingly, the synthesizer having the output frequency Fout that is integer times the reference frequency Fref is called an integer-N frequency synthesizer.

However, the prior art frequency synthesizer has various disadvantages. For example, a phase noise performance is degraded when a channel spacing is reduced. The channel spacing refers to a spacing between frequencies that may be obtained by using the frequency synthesizer. In case of the integer-N phase locked loop of FIG. 1, the output frequency Fout is integer times the reference frequency Fref. Thus, the output frequency Fout may be increased or decreased by a unit of the reference frequency Fref, and the channel spacing is same as the reference frequency Fref.

Therefore, the reference frequency Fref should be lowered in order to reduce the channel spacing, that is, to in order to obtain dense frequencies. However, for stability of the phase locked loop, it is preferable that a bandwidth of the phase locked loop is less than one tenth of the reference frequency Fref. Therefore, the reference frequency Fref should be reduced in order to reduce the channel spacing, but the bandwidth is also reduced when the reference frequency Fref is reduced. Moreover, the phase noise is increased as the bandwidth of the phase locked loop is decreased because of an effect of a phase noise of the voltage controlled oscillator 14.

For example, when the output frequency Fout is required to be varied by having the channel spacing of 100 KHz within a range between 2.0 GHz and 2.1 GHz, the reference frequency Fref should be 100 KHz, and N should be capable of being varied within a range between 20000 and 21000. In addition, it is preferable that the bandwidth of the phase locked loop is no more than 10 KHz.

The above references are incorporated by reference herein where appropriate for appropriate teachings of additional or alternative details, features and/or technical background.

SUMMARY OF THE INVENTION

An object of embodiments of the application is to reduce or solve at least the above problems and/or disadvantages in the related art or to provide at least the advantages described herein in whole or in part.

Another object of the application is to provide a frequency synthesizer having a low phase noise characteristic while having narrow channel spacing.

Another object of the application is to provide a frequency synthesizer having a low phase noise characteristic while having a narrow channel spacing by overcoming a correlation between the channel spacing and the phase noise.

Another object of the application is to provide a frequency synthesizer having a low phase noise characteristic while having a narrow channel spacing by using two phase locked loops.

To achieve objects of the application in whole or in part, there is provided a frequency synthesizer that can include an integer-N phase locked loop to receive a signal having a reference frequency to output a signal having a first output frequency, a fractional-N phase locked loop to receive the signal having the reference frequency to output a signal having a second output frequency and a circuit to combine the signal having the first output frequency and the signal having the second output frequency to output a signal having an output frequency of the frequency synthesizer.

To achieve objects of the application in whole or in part, there is provided a frequency synthesizer that can include a reference frequency oscillator to output a reference frequency signal, an integer-N phase locked loop to receive the reference frequency signal to output a signal having a first output frequency, a fractional-N phase locked loop to receive the reference frequency signal to output a signal having a second output frequency, a first divider to receive the signal having the second output frequency to output an in-phase signal having a third output frequency corresponding to 1/L of the second output frequency, a second divider to receive the signal having the second frequency to output a quadrature signal having the third output frequency, a first frequency adder to receive the signal having the first output frequency and the in-phase signal having the third output frequency to output an in-phase signal having a frequency corresponding to a sum of the first output frequency and the third output frequency and a second frequency adder to receive the signal having the first output frequency and the quadrature signal having the third output frequency to output a quadrature signal having the frequency corresponding to the sum of the first output frequency and the third output frequency, wherein L is an integer.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The embodiments will be described in detail with reference to the following drawings in which like reference numerals refer to like elements wherein:

FIG. 5(a) is a diagram illustrating a frequency adder using a filter and FIG. 5(b) is a diagram illustrating a frequency adder using an image rejection.

DETAILED DESCRIPTION OF THE PREFERRED EMBODIMENTS

Embodiments according to the application will be described with reference to the accompanying drawings. Such embodiments are exemplary and not to be construed as limiting. Many alternatives, modifications, and variations will be apparent to those skilled in the art. Interpretations of terms and/or wordings used in description and claims should not be limited to common or literal meanings.

The bandwidth of the phase locked loop can be limited in a related art fractional-N phase locked loop of a sigma-delta type so as to reduce a spur or a quantization noise. More specifically, while the sigma-delta frequency synthesizer allows a fine frequency adjustment by a unit of few Hz even when the reference frequency Fref applied externally is higher than tens of Mhz, the bandwidth of the phase locked loop cannot be widened unconditionally because of the quantization noise that is a characteristic of the sigma-delta frequency synthesizer. Generally, the bandwidth of the phase locked loop is selected from one thousandth of the reference frequency. Therefore, the phase locked loop has the bandwidth of tens of KHz when the reference frequency is tens of MHz, thereby acting as a factor for increasing the phase noise of the phase locked loop.

In addition, the phase noise of the related art fractional-N phase locked loop of the sigma-delta type increases as an operating frequency is increased. Therefore, a large amount of noises is generated when the sigma-delta type phase locked loop is used to obtain the high frequency of hundreds of MHz or few Ghz.

Figure 1:
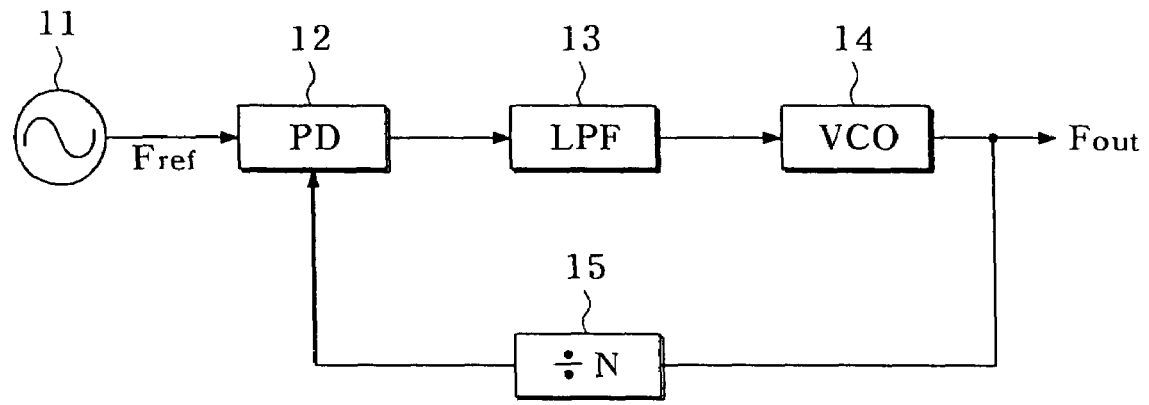
FIG. 1 is a diagram illustrating a prior art frequency synthesizer.
Figure 2:
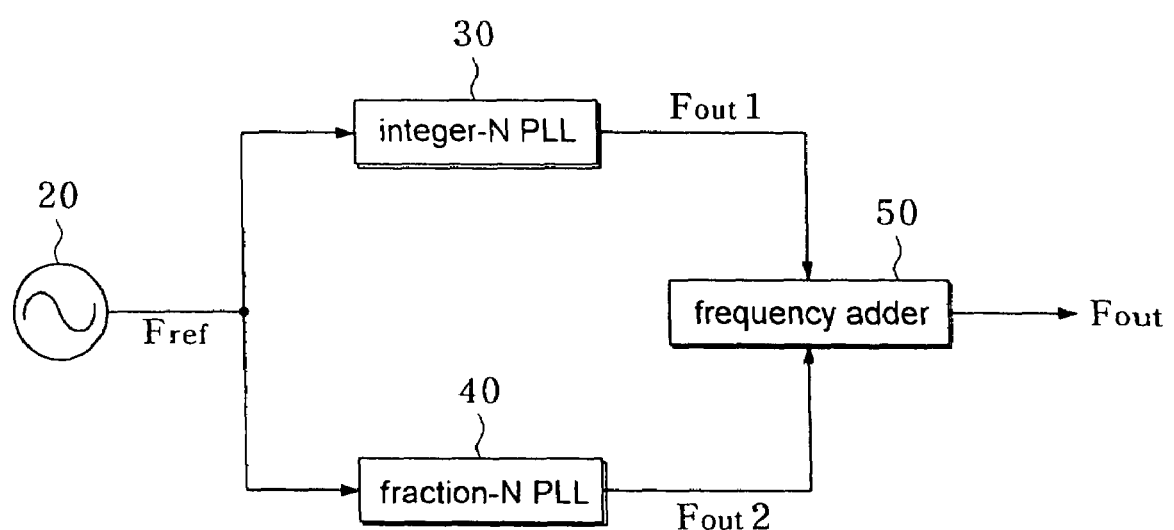
FIG. 2 is a diagram illustrating a frequency synthesizer in accordance with an embodiment of the application.

FIG. 2 is a diagram illustrating a first embodiment of a frequency synthesizer in accordance with the application. As shown in FIG. 2, a frequency synthesizer can include a reference frequency oscillator 20, an integer-N phase locked loop 30, a fractional-N phase locked loop 40 and a frequency adder 50.

The reference frequency oscillator 20 provides a signal having a reference frequency Fref to the integer-N phase locked loop 30 and the fractional-N phase locked loop 40. The reference frequency oscillator 20, for instance, may be a crystal oscillator. However, embodiments are not intended to be so limited.

The integer-N phase locked loop 30 can receive the signal having the reference frequency Fref and output a signal having a first output frequency Fout1 corresponding to integer times the reference frequency Fref Various types of the integer-N phase locked loop 30 such as a direct division type, a prescaler type, a pulse swallow type or the like may be used as the integer-N phase locked loop 30.

The fractional-N phase locked loop 40 can receive the signal having the reference frequency Fref and output a signal having a second output frequency Fout2 corresponding to a fractional multiple of the reference frequency Fref. Various types of the fractional-N phase locked loop 40 such as a current injection type, a sigma-delta modulation type or the like may be used as the fractional-N phase locked loop 40.

The frequency adder 50 can receive an output signal of the integer-N phase locked loop 30 and an output signal of the fractional-N phase locked loop 40 to output a signal having a frequency corresponding to a sum of the first output frequency Fout1 and the second output frequency Fout2, e.g., an output frequency Fout.

Since a phase noise of a final output signal, e.g., the signal having the output frequency Fout, can correspond to a sum of a phase noise of the signal having the first output frequency Fout1 and a phase noise of the signal having the second output frequency Fout2. It is preferable that a design method be applied in order to reduce (e.g., or minimize) a channel spacing and/or the phase noise. One exemplary embodiment of a design method will now be described.

First, the integer-N phase locked loop (e.g., integer-N PLL 30) can be designed to provide a highest frequency possible for a generation of a high frequency signal provided to a logic circuit (e.g., the frequency adder 50). A degradation of the phase noise caused by the high frequency can be overcome by large bandwidth. The fractional-N phase locked loop (e.g., fractional-N PLL 40) can have a relatively small bandwidth for a narrow channel spacing. The degradation of the phase noise generated can be reduced or overcome by reducing the second output frequency Fout2. Generally, when the frequency is reduced to one half, a RMS (root mean square) phase noise is reduced to one half.

Figure 3:
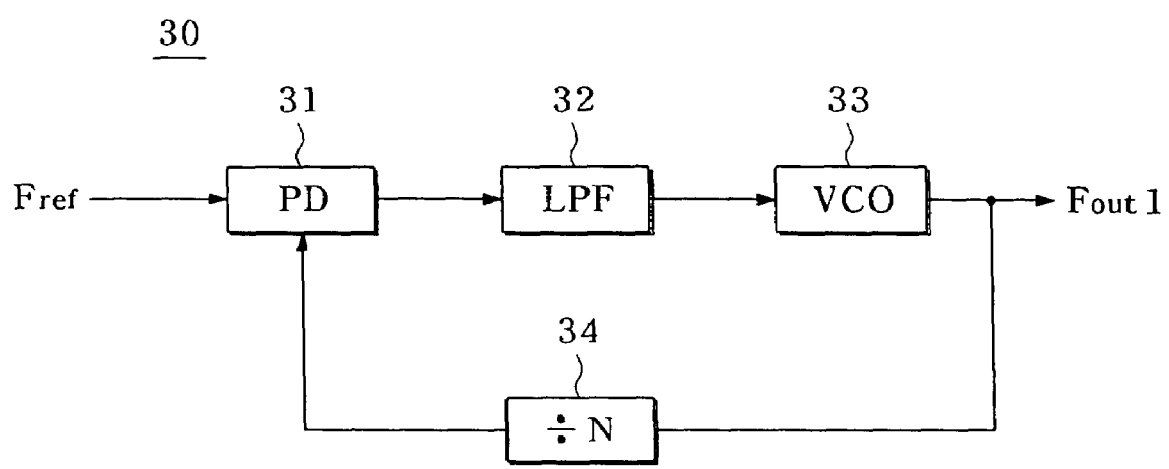
FIG. 3 is a diagram illustrating an embodiment of an exemplary integer-N phase locked loop for use in the frequency synthesizer of FIG. 2.

FIG. 3 is a diagram illustrating an embodiment of the integer-N phase locked loop 30 employed in the frequency synthesizer of FIG. 2. In FIG. 3, the integer-N phase locked loop 30 is shown as a direct division type. However, embodiments of the application as not intended to be limited by such an exemplary disclosure.

Referring to FIG. 3, the integer-N phase locked loop 30 can include a phase detector 31, a low pass filter 32, a voltage controlled oscillator 33 and a frequency divider 34. The phase detector 31 can output a voltage corresponding to a phase difference between the signal having the reference frequency Fref and a signal being outputted by the frequency divider 34.

The low pass filter 32 can output a voltage where a high frequency component of the voltage being outputted from the phase detector 31 is reduced or removed therefrom. The voltage controlled oscillator 33 can output the signal having a frequency corresponding to the voltage being outputted from the low pass filter 32, e.g., the first output frequency Fout1. The frequency divider 34 can output a signal having a frequency Fout1/N that corresponds to one Nth of the first output frequency Fout1.

The exemplary frequency synthesizer shown in FIG. 3 therefore outputs the first output frequency Fout1 that is N times the reference frequency Fref by having the above-described components.

Figure 4:
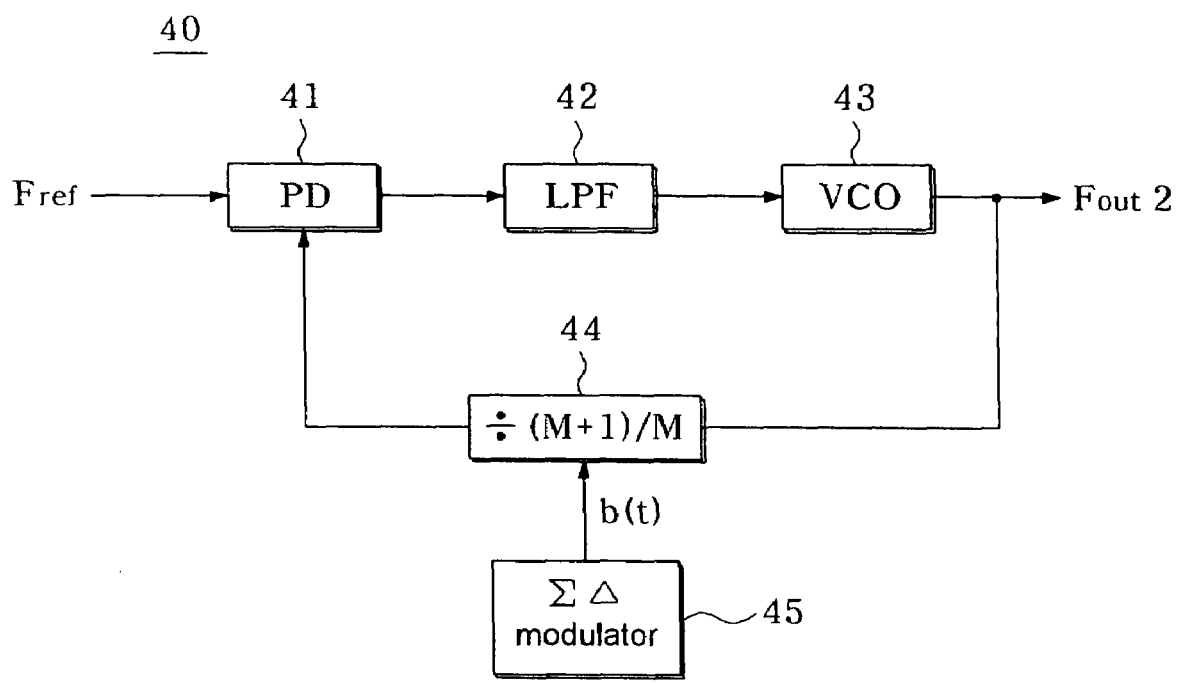
FIG. 4 is a diagram illustrating an embodiment of an exemplary fractional-N phase locked loop for use in the frequency synthesizer of FIG. 2.

FIG. 4 is a diagram illustrating an embodiment of the fractional-N phase locked loop 40 employed in the frequency synthesizer of FIG. 2. In FIG. 4, a fractional-N phase locked loop of sigma-delta modulation type is shown. However, embodiments of the application are not intended to be limited by such an exemplary disclosure.

As shown in FIG. 4, the fractional-N phase locked loop 40 can include a phase detector 41, a low pass filter 42, a voltage controlled oscillator 43, a dual-modulus prescaler 44 and a sigma-delta modulator 45. The phase detector 41 can output a voltage corresponding to a phase difference between the signal having the reference frequency Fref and a signal being outputted by the dual-modulus prescaler 44.

The low pass filter 42 can output a voltage where a high frequency component of the voltage being outputted from the phase detector 41 is reduced or removed therefrom. The voltage controlled oscillator 43 can output the signal having a frequency corresponding to the voltage being outputted from the low pass filter 42, e.g., the second output frequency Fout2.

The dual-modulus prescaler 44 can perform an operation where the second output frequency Fout2 is divided by M for L1 times, and an operation wherein the second output frequency Fout2 is divided by (M+1) for L2 times. Since the second output frequency Fout2 has a value of Fref×M when the dual-modulus prescaler 44 successively divides the second output frequency Fout2 by M and a value of Fref×(M+1)

when the dual-modulus prescaler 44 successively divides the second output frequency Fout2 by (M+1), the second output frequency Fout2 has a value between Fref×M and Fref×(M+1) (e.g., the second output frequency Fout2 is divided by M for L1 times and divided by (M+1) for L2 times). The second output frequency Fout2 can be determined by a ratio L1:L2 that is a ratio of the number of the divisions of the second output frequency Fout2 by M and the number of the divisions of the second output frequency Fout2 by (M+1) by the dual-modulus prescaler 44.

For example, when the reference frequency Fref is 10 MHz and M is 10, and (L1, L2) is set to be (100, 0), the second output frequency Fout2 is 100.0 MHz. When (L1, L2) is set to be (99, 1), the second output frequency Fout2 is 100.1 MHz. When (L1, L2) is set to be (98, 2), the second output frequency Fout2 is 100.2 MHz. When (L1, L2) is set to be (0, 100), the second output frequency Fout2 is 110.0 MHz. However, the dual-modulus prescaler 44 can have a drawback of a fractional spurs whereby a periodic (L1+L2) phase error is generated in the output frequency.

The sigma-delta modulator 45 can generate a pseudorandom number b(t) to be transmitted to the dual-modulus prescaler 44 in order to reduce or remove the fractional spurs. The dual-modulus prescaler 44 can select one of M and (M+1) according to b(t), thereby reducing the fractional spurs.

Figure 5A:
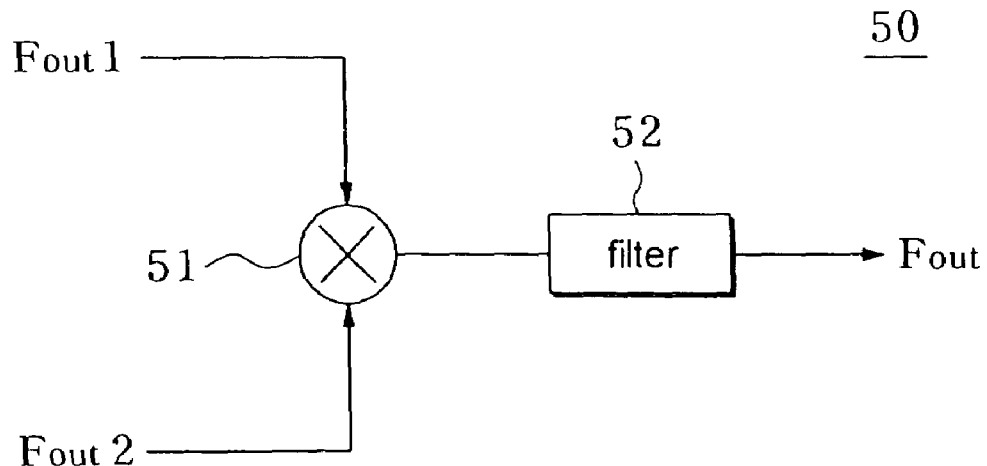
FIGS. 5(a)-(b) are diagrams illustrating embodiments of exemplary frequency adders employed in the frequency synthesizer of FIG. 2, where
Figure 5B:
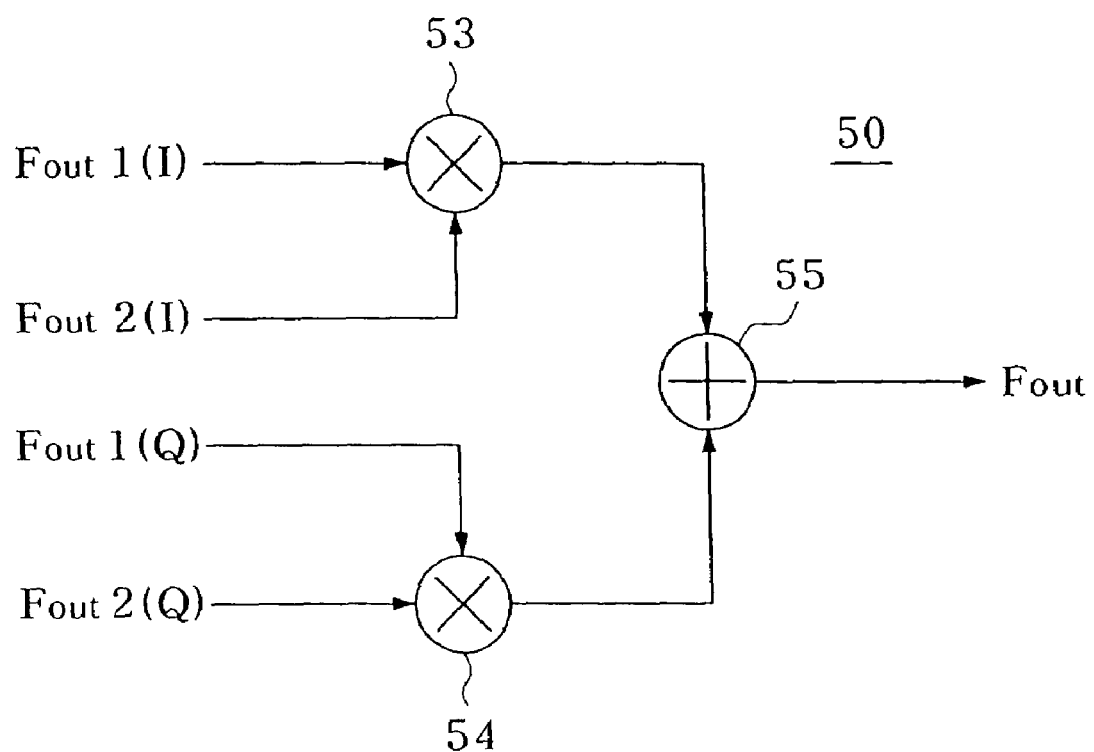

FIGS. 5(a)-(b) are diagrams illustrating exemplary embodiments of a frequency adder that can be employed in the frequency synthesizer of FIG. 2. FIG. 5(a) is a diagram illustrating an embodiment of the frequency adder 50 using a filter, and FIG. 5(b) is a diagram illustrating an embodiment of the frequency adder 50 using an image rejection.

As shown in FIG. 5(a), the frequency adder 50 can include a mixer 51 and a filter 52. The mixer 51 can output a signal that is a combination (e.g., a product) of the signal having the first output frequency Fout1 and the signal having the second output frequency Fout2. The output of the mixer 51 can include an unwanted frequency (e.g., Fout1−Fout2) as well as a desired frequency (e.g., Fout1+Fout2). The filter 52 can remove the unwanted frequency (e.g., Fout1−Fout2) from the frequencies being outputted from the mixer 51 and output the desired frequency (e.g., Fout1+Fout2), as the output frequency Fout.

As shown in FIG. 5(b), the frequency adder 50 can include a first mixer 53, a second mixer 54 and an adder 55. The first mixer 53 can output a signal that is combination (e.g., a product) of an in-phase signal Fout1(I) having the first output frequency Fout1 and an in-phase signal Fout2(I) having the second output frequency Fout2. The second mixer 54 can output a signal that is a combination (e.g., a product) of a quadrature signal Fout1(Q) having the first output frequency Fout1 and quadrature signal Fout2(Q) having the second output frequency Fout2.

The adder 55 can output a combination (e.g., a sum) of the outputs of the first mixer 53 and the second mixer 54. An image component of the output of the first mixer 53 and an image component of the output of the second mixer 54 has a same magnitude and an inverted phase. Therefore, the image component can be reduced or removed from the adder 55 such that the adder 55 outputs the signal having a pure frequency (e.g., Fout1+Fout2), e.g., the output frequency Fout without the image component.

Embodiments of frequency synthesizer, in accordance with the application will be described using an example where an output frequency Fout is required to be varied by having the channel spacing of 100 KHz within a range between 2.0 GHz and 2.1 GHz.

The variable output frequency Fout having the channel spacing of 100 KHz may be obtained when the reference frequency Fref is set to be 10 MHz, N is set to range from 190 to 200, M is set to be 10, L1 is set to range from 0 to 100 and L2 is set to be (100−L1). Since the integer-N phase locked loop 30 can output the signal having the frequency corresponding to (Fref×N), the integer-N phase locked loop 30 outputs the signal having the first output frequency Fout1 that varies by 10 MHz within a range between 1.90 GHz and 2.00 GHz. The fractional-N phase locked loop 40 can output the signal having the second output frequency Fout2 that varies by Fref/(L1+L2) within a range between (Fref×M) and (Fref×(M+1)). In this example, the fractional-N phase locked loop 40 can output the signal having the second output frequency Fout2 that varies by 100 KHz within a range between 100 MHz and 110 MHz. Therefore, the frequency adder 50 can output the output frequency Fout (e.g., Fout1+Fout2) that varies by 100 KHz within a range between 2.0 GHz and 2.1 GHz.

In this example, since the reference frequency Fref inputted to the integer-N phase locked loop 30 is 10 MHz, which is one hundred times larger than that of the related art, a bandwidth of the integer-N phase locked loop 30 may be set to be 1 MHz, which is one hundred times larger than that of the related art. Therefore, the phase noise of the integer-N phase locked loop according to embodiments may be reduced more than the related art. While the first output frequency Fout1 that is outputted from the integer-N phase locked loop 30 can have the channel spacing of 10 MHz, the output frequency Fout of the frequency synthesizer since the second output frequency Fout2 that is outputted from the fractional-N phase locked loop 40 can have the channel spacing of 100 KHz. Therefore, embodiments of a frequency synthesizer in accordance with the application can be advantageous over the related art in that the frequency synthesizer has a narrower channel spacing and/or a lower phase noise. Further, while the output of the fractional-N phase locked loop 40 may have the phase noise caused by the fractional spurs, the phase noise may be reduced by the fractional-N phase locked loop of the sigma-delta type shown in FIG. 4.

From above description, N, M, L1 and L2 should preferably be programmable in order to obtain sufficiently wide frequency range as well as the narrow channel spacing. Therefore, it is preferable that N, M, L1 and L2 are programmable. However, embodiments are not intended to be so limited.

In addition, since a fine frequency adjustment is possible for the fractional-N phase locked loop 40, it is preferable that the channel spacing of the second output frequency Fout2 being outputted from the fractional-N phase locked loop 40 is smaller than that of the first output frequency Fout1 being outputted from the integer-N phase locked loop 30. Moreover, since the integer-N phase locked loop 30 may simply generate the high frequency, it is preferable that the first output frequency Fout1 being outputted from the integer-N phase locked loop 30 is higher than the second output frequency Fout2 being outputted from the fractional-N phase locked loop 40.

Figure 6:
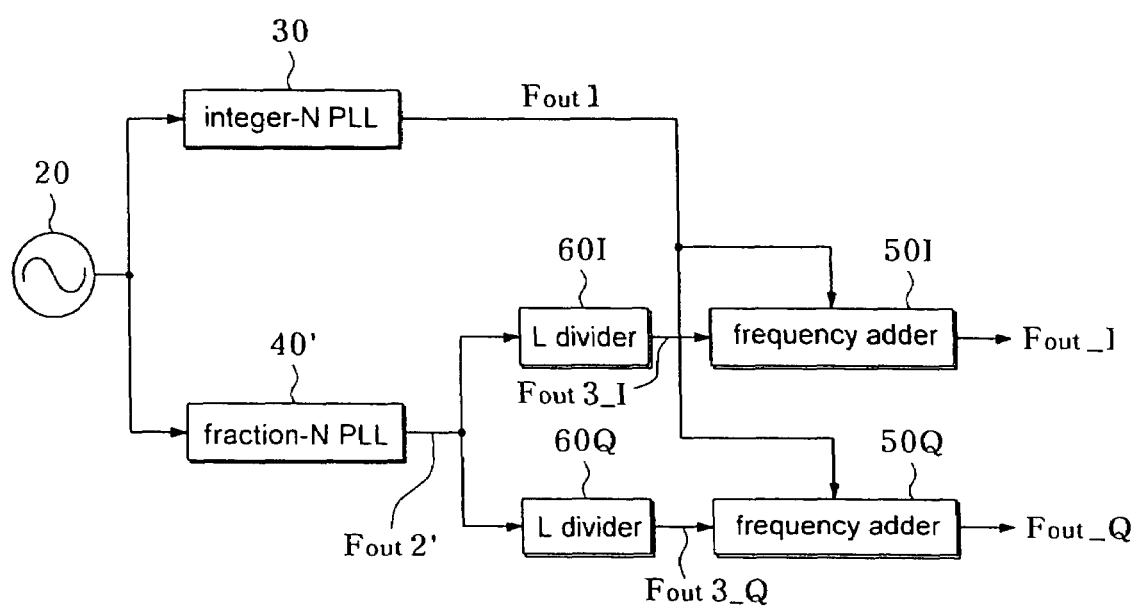
FIG. 6 is a diagram illustrating a frequency synthesizer in accordance with another embodiment of the application.

FIG. 6 is a diagram illustrating a second embodiment of a frequency synthesizer in accordance with the application. As shown in FIG. 6, the frequency synthesizer can include a reference frequency oscillator 20, an integer-N phase locked loop 30, a fractional-N phase locked loop 40', a first L divider 60I, a second L divider 60Q, a first frequency adder 50I and a second frequency adder 50Q.

Since the reference frequency oscillator 20 and the integer-N phase locked loop 30 are similar to those of FIG. 2, a detailed description thereof is omitted here.

The fractional-N phase locked loop 40' can receive a signal having a reference frequency Fref and output a signal having a second output frequency Fout2' corresponding to a fractional multiple of the reference frequency Fref. Various types of the fractional-N phase locked loop 40' such as the current injection type, the sigma-delta modulation type or the like may be used as the fractional-N phase locked loop 40'. The fractional-N phase locked loop 40' of FIG. 6 can output the signal having the second output frequency Fout2' that is L times higher than that of the fractional-N phase locked loop 40 of FIG. 2, and the second output frequency Fout2' is lowered or divided L times by the L dividers 60I and 60Q for input to the frequency adders 50I and 50Q.

The first L divider 60I and the second L divider 60Q can output a signal having a third output frequency Fout3 corresponding to one Lth of the second output frequency Fout2'. L can be a multiple of 2 such as 2, 4 and 6. _I or _Q after Fout3 in FIG. 6 represents that a phase difference can exist. For example, _I represents an in-phase signal, and _Q represents a quadrature signal. Therefore, a signal being outputted from the first L divider 60I and a signal being outputted from the second L divider 60Q preferably have a same frequency and have a phase difference of 90°. The phase difference may be obtained by differentiating a starting point of a period or the like. For example, the starting point of the period of the second L divider 60Q can lag that of the first L divider 60I by L/2.

The first frequency adder 50I can receive an output signal of the integer-N phase locked loop 30 and an output signal of the first L divider 60I to output a signal having a frequency corresponding to a sum of the first output frequency Fout1 and the third output frequency Fout3, e.g., an output frequency Fout. The second frequency adder 50Q can receive the output signal of the integer-N phase locked loop 30 and an output signal of the second L divider 60Q to output the signal having a frequency corresponding to the sum of the first output frequency Fout1 and the third output frequency Fout3, e.g., an output frequency Fout. Since the signal being outputted by the first frequency adder 50I and the signal being outputted by the second frequency adder 50Q preferably have the phase difference of 90°, _I and _Q are shown after reference numeral Fout. The frequency synthesizer in accordance with the second embodiment of the application can generate the I and Q signals simultaneously. For example, the first frequency adder 50I or the second frequency adder 50Q may be configured as shown in FIG. 5(a).

As described above, embodiments of methods and apparatus for frequency synthesis have various advantages. For example, embodiments of methods and frequency synthesizers according to the application can have a low phase noise characteristic while having the narrow channel spacing or overcome a correlation between the channel spacing and the phase noise.

To obtain a high frequency and narrow channel spacing using the related art integer-N phase locked loop, a deterioration due to the phase noise caused by the high frequency and a deterioration due to the phase noise because of the small bandwidth are generated. Similar disadvantages occur when obtaining the high frequency and the narrow channel spacing using the related art fractional-N phase locked loop. However, in accordance with embodiments of methods or apparatus for frequency synthesis according to the application, only the degradation of the phase noise caused by the high frequency is generated since the integer-N phase locked loop has the large bandwidth, and only the degradation of the phase noise caused by the small bandwidth is generated since the fractional-N phase locked loop has a low frequency. Therefore, phase noise of the frequency synthesizer of embodiments may have a smaller value than that of the related art integer-N phase locked loop and the related art fractional-N phase locked loop.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A frequency synthesizer, comprising:
   an integer-N phase locked loop to receive a signal having a reference frequency to output a signal having a first output frequency;
   a fractional-N phase locked loop to receive the signal having the reference frequency to output a signal having a second output frequency; and
   a circuit to combine the signal having the first output frequency and the signal having the second output frequency to output a signal having an output frequency of the frequency synthesizer.

2. The frequency synthesizer of claim 1, wherein the second output frequency is lower than the first output frequency.

3. The frequency synthesizer of claim 1, wherein a channel spacing of the second output frequency is narrower than that of the first output frequency.

4. The frequency synthesizer of claim 1, wherein the integer-N phase locked loop comprises:
   a phase detector to output a voltage corresponding to a phase difference between the signal having the reference frequency and a divided output signal;
   a low pass filter to reduce a high frequency component of the voltage output by the phase detector;
   a voltage controlled oscillator to output the signal having the first output frequency corresponding to a voltage output by the low pass filter; and
   a frequency divider to divide the first output frequency by N, where N is an integer, and to output the divided output signal.

5. The frequency synthesizer of claim 4, wherein the fractional-N phase locked loop comprises:
   a second phase detector to output a voltage corresponding to a phase difference between the signal having the reference frequency and a second divided signal;
   a second low pass filter to receive the voltage output by the second phase detector and to remove a high frequency component thereof;
   a second voltage controlled oscillator to output the signal having the second output frequency corresponding to the voltage output by the second low pass filter; and
   a dual-modulus prescaler to divide the second output frequency by M and (M+1) in a predetermined ratio to output the second divided signal, where M is an integer, and wherein N, M and the predetermined ratio are programmable.

6. The frequency synthesizer of claim 1, wherein the fractional-N phase locked loop comprises a sigma-delta modulation type fractional-N phase locked loop.

7. The frequency synthesizer of claim 1, wherein the fractional-N phase locked loop comprises:
   a phase detector to output a voltage corresponding to a phase difference between the signal having the reference frequency and a second divided signal;
   a low pass filter to receive a voltage output by the phase detector and to remove a high frequency component thereof;
   a voltage controlled oscillator to output the signal having the second output frequency corresponding to the voltage output by the low pass filter; and
   a dual-modulus prescaler to divide the second output frequency by M and (M+1) in a predetermined ratio to output the second divided signal, where M is an integer.

8. The frequency synthesizer of claim 7, wherein the predetermined ratio is determined by selecting one of M and (M+1) according to a pseudorandom number outputted by the sigma-delta modulator, and wherein M and the predetermined ratio are programmable.

9. The frequency synthesizer of claim 1, wherein the circuit comprises a frequency adder to receive the signal having the first output frequency and the signal having the second output frequency to output the signal having the output frequency corresponding to a sum of the first output frequency and the second output frequency.

10. The frequency synthesizer of claim 9, wherein the frequency adder comprises:
    a mixer to output a signal obtained by multiplying the signal having the first output frequency and the signal having the second output frequency; and
    a filter to selectively output a signal in a prescribed band of the signal outputted by the mixer.

11. The frequency synthesizer of claim 9, wherein the signal having the first output frequency comprises an in-phase signal having the first output frequency and a quadrature signal having the first output frequency, wherein the signal having the second output frequency comprises an in-phase signal having the second output frequency and a quadrature signal having the second output frequency, and wherein the frequency adder comprises:
    a first mixer to output a signal obtained by multiplying the in-phase signal having the first output frequency and the in-phase signal having the second output frequency;
    a second mixer to output a signal obtained by multiplying the quadrature signal having the first output frequency and the quadrature signal having the second output frequency; and
    an adder to output a signal obtained by adding the signal outputted by the first mixer and the signal outputted by the second mixer.

12. A frequency synthesizer comprising:
    a reference frequency oscillator to output a reference frequency signal;
    an integer-N phase locked loop to receive the reference frequency signal to output a signal having a first output frequency;
    a fractional-N phase locked loop to receive the reference frequency signal to output a signal having a second output frequency;
    a first divider to receive the signal having the second output frequency to output an in-phase signal having a third output frequency corresponding to 1/L of the second output frequency;
    a second divider to receive the signal having the second frequency to output a quadrature signal having the third output frequency;
    a first frequency adder to receive the signal having the first output frequency and the in-phase signal having the third output frequency to output an in-phase signal having a frequency corresponding to a sum of the first output frequency and the third output frequency; and
    a second frequency adder to receive the signal having the first output frequency and the quadrature signal having the third output frequency to output a quadrature signal having the frequency corresponding to the sum of the first output frequency and the third output frequency, wherein L is an integer.

13. The frequency synthesizer of claim 12, wherein the second output frequency is lower than the first output frequency, wherein a channel spacing of the second output frequency is narrower than that of the first output frequency, and wherein L is a multiple of 2.

14. The frequency synthesizer of claim 11, wherein the integer-N phase locked loop comprises:
    a phase detector to output a voltage corresponding to a phase difference between the reference frequency signal and a divided output signal;
    a low pass filter to reduce a high frequency component of the voltage output by the phase detector;
    a voltage controlled oscillator to output the signal having the first output frequency corresponding to a voltage output by the low pass filter; and
    a frequency divider to divide the first output frequency by N, where N is an integer, and to output the divided output signal.

15. The frequency synthesizer of claim 14, wherein N is programmable, and wherein the fractional-N phase locked loop comprises a sigma-delta modulation type fractional-N phase locked loop where M is programmable.

16. The frequency synthesizer of claim 12, wherein the fractional-N phase locked loop comprises:
    a phase detector to output a voltage corresponding to a phase difference between the reference frequency signal and a second divided signal;
    a low pass filter to receive the voltage output by the phase detector and to remove a high frequency component thereof;
    a voltage controlled oscillator to output the signal having the second output frequency corresponding to the voltage output by the low pass filter; and
    a dual-modulus prescaler to divide the second output frequency by M and (M+1) in a predetermined ratio to output the second divided signal, wherein M is an integer.

17. The frequency synthesizer in accordance with claim 16, wherein the predetermined ratio is determined by selecting one of M and (M+1) according to a pseudorandom number outputted by the sigma-delta modulator, and wherein M and the predetermined ratio are programmable.

18. The frequency synthesizer of claim 12, wherein the first frequency adder comprises:
- a first mixer to output a signal obtained by multiplying the signal having the first output frequency and the in-phase signal having the third output frequency; and
- a first filter to selectively output a signal in a predetermined band selected from of the signal outputted by the first mixer, and wherein the second frequency adder comprises:
    - a second mixer to output a signal obtained by multiplying the signal having the first output frequency and the quadrature signal having the third output frequency; and
    - a second filter to selectively output the signal in the predetermined band selected from the signal outputted by the second mixer.

19. The frequency synthesizer of claim 5, wherein the circuit comprises:
- a first divider to receive the signal having the second output frequency to output an in-phase signal having a third output frequency corresponding to 1/L of the second output frequency;
- a second divider to receive the signal having the second frequency to output a quadrature signal having the third output frequency;
- a first frequency adder to receive the signal having the first output frequency and the in-phase signal having the third output frequency to output an in-phase signal having a frequency corresponding to a sum of the first output frequency and the third output frequency; and
- a second frequency adder to receive the signal having the first output frequency and the quadrature signal having the third output frequency to output a quadrature signal having the frequency corresponding to the sum of the first output frequency and the third output frequency, wherein L is an integer.

* * * * *